US008519077B2

(12) United States Patent
Jia

(10) Patent No.: US 8,519,077 B2
(45) Date of Patent: Aug. 27, 2013

(54) N-TYPE CONJUGATED COMPOUNDS CONTAINING DIBORYLENE UNITS, METHODS OF MAKING, AND A DEVICE COMPRISING THE COMPOUND

(75) Inventor: Li Jia, Hudson, OH (US)

(73) Assignee: The University of Akron, Akron, OH (US)

(*) Notice: Subject to any disclaimer, the term of this patent is extended or adjusted under 35 U.S.C. 154(b) by 309 days.

(21) Appl. No.: 13/058,415

(22) PCT Filed: Aug. 10, 2009

(86) PCT No.: PCT/US2009/053268
§ 371 (c)(1),
(2), (4) Date: Feb. 10, 2011

(87) PCT Pub. No.: WO2010/019499
PCT Pub. Date: Feb. 18, 2010

(65) Prior Publication Data
US 2011/0133174 A1     Jun. 9, 2011

Related U.S. Application Data

(60) Provisional application No. 61/088,060, filed on Aug. 12, 2008.

(51) Int. Cl.
*C08G 79/08*     (2006.01)
(52) U.S. Cl.
USPC .... 528/4; 528/7; 528/8; 257/40; 257/E51.027
(58) Field of Classification Search
USPC .................. 528/4, 7, 8; 257/40, E51.027
See application file for complete search history.

(56) References Cited

U.S. PATENT DOCUMENTS

| | | | |
|---|---|---|---|
| 3,109,031 | A | 10/1963 | Goldstein |
| 3,166,522 | A | 1/1965 | Kitasaki |
| 3,203,909 | A | 8/1965 | Steinberg |
| 3,203,929 | A | 8/1965 | Kitasaki et al. |
| 3,203,930 | A | 8/1965 | Bower |
| 3,269,992 | A | 8/1966 | Mayes |
| 4,167,616 | A | 9/1979 | Bollinger |
| 6,025,453 | A | 2/2000 | Keller et al. |
| 2007/0215864 | A1 | 9/2007 | Luebban et al. |

OTHER PUBLICATIONS

Nunzi, J. M., "Organic photovoltaic materials and devices," *C.R. Physique* 3, 523-542, 2002.
Yu, G et al., "Polymer Photovoltaic Cells: Enhanced Efficiencies via a Network of Internal Donor-Acceptor Heterojunctions," *J. Science* 270, 1789-1791, 1995.
Brabec, C. J. et al., "A Low-Bandgap Semiconducting Polymer for Photovoltaic Devices and Infrared Emitting Diodes," *Adv. Funct. Mater.*, 12, 709-712, 2002.
Shaheen, S. et. al., "2.5% efficient organic plastic solar cells," *Appl. Phys. Lett.*, 78, 841-843, 2001.
Enemaerke, R. J. et al., "Is samarium diiodide an inner- or outer-sphere electron donating agent?" *Chem. Commun.*, 343-344, 1999.

*Primary Examiner* — Shane Fang
(74) *Attorney, Agent, or Firm* — Renner Kenner Greive Bobak Taylor & Weber

(57) ABSTRACT

N-type conjugated compounds are disclosed which include at least one conjugated electron-acceptor unit The conjugated electron-acceptor unit includes a diborylene unit. The compounds find application in an electron acceptor layer of an electronic device.

32 Claims, 7 Drawing Sheets

N-TYPE CONJUGATED COMPOUNDS CONTAINING DIBORYLENE UNITS, METHODS OF MAKING, AND A DEVICE COMPRISING THE COMPOUND

This is application claims the priority, PCT Application Serial No. PCT/US2009/053268, filed on Aug. 10, 2009, and claims the benefit of Application Ser. No. 61/088,060, filed on Aug. 12, 2008. The disclosures of both of these applications are incorporated herein by reference in their entireties.

BACKGROUND

The exemplary embodiment relates to the design, synthesis and devices comprising a class of n-type (electron-mobile) conjugated compounds which can have exceptionally high electron affinities. The exemplary compounds (monomers, oligomers, and polymers) contain highly electron-accepting cyclic diborylene units. The compounds find particular application in electronic devices, such as organic photovoltaic cells (OPVs), and will be described with particular reference thereto. However, it is to be appreciated that the present exemplary embodiment is also amendable to other like applications.

Specific functions of many electronic components and devices arise from the unique interactions existing between p-type and n-type conducting and semiconducting materials. Inorganic conductors and semiconductors entirely dominated the electronic industry until a few years ago. Recently, there has been a major worldwide research effort to develop conducting and semiconducting organic compounds and polymers, and to use them to fabricate plastic electronic devices, such as organic photovoltaic devices (OPVs), organic light emitting diodes (OLEDs) and organic field effect transistors (OFETs). Plastic electronic components offer several potential advantages over traditional devices made of inorganic materials since they are flexible and can be manufactured by inexpensive ink-jet printing or roll-to-roll coating technologies.

A contemporary OPV cell contains an electron donor and an electron acceptor in the active layer which spaces an anode and cathode. The interface of the two materials is called a heterojunction, where two intrinsic chemical potentials for electrons exist corresponding to the energy offset between the lowest unoccupied molecular orbital (LUMO) and the highest occupied molecular orbital (HOMO) of the donor and acceptor. Upon light absorption, electrons in the HOMO of the donor and the acceptor are excited into their respective LUMO to form excitons, i.e., Coulombically bound electron-hole pairs. The Coulombic energy, often called exciton binding energy, must be overcome to further separate the electron and the hole. This is achieved by the energy offsets at the heterojunction. If the LUMO offset is larger than the binding energy of the donor exciton, the electrons in the donor phase transfer into the acceptor phase when the excitons diffuse to the heterojunction. Similarly, if the HOMO offset is sufficient to overcome the binding energy of the acceptor exciton, the excitons in the acceptor phase dissociate at the heterojunction. After charge transfer at the heterojunction, the electrons move away into the acceptor phase, driven by the photoinduced electrical potential and the concentration gradient, and the holes move into the donor phase. The anode and the cathode then collect the electrons and holes, respectively, often with the assistance of a bias potential. The overall energy conversion efficiency of the device depends on the efficiencies of the individual events, i.e., light absorption, exciton diffusion to the heterojunction, exciton dissociation at the heterojunction, and charge transport to the electrodes.

An early heterojunction cell adopted a two-layered planar geometry. See, Tang, C. W., Appl. Phys. Lett. 48, 183-185, 1986. The efficiency of the planar device (~1%) is inherently limited by the exciton diffusion length, which is ~5-10 nm in organic semiconductors (Nunzi, J. M., C.R. Physique 3, 523-542, 2002), before the hole and the electron recombine. Excitons formed at the location further than 10 nm from the heterojunction do not contribute to the generation of electrical current.

Bulk heterojunction cells were introduced around the mid 1900s. See, Yu, G et al., J. Science 270, 1789-1791, 1995. These included a blend of $C_{60}$ as the electron acceptor and a poly(p-phenylene vinylene)-type polymer as the donor to form one single active layer. Within the active layer, the two components segregate into continuous network domains and as such result in a large increase in the donor-acceptor interfacial area. The efficiency of such bulk heterojunction device can reach 5%.

Progress has also been made in the development of OPV materials, some of which were originally developed for the FET and LED applications. Regioregular poly(3-alkylthiophene)s (rr-P3ATs) tend to exhibit good optical absorption characteristics and excellent charge mobility compared to the original donor, poly[2-methoxy, 5-(2'-ethyl-hexyloxy)-p-phenylene-vinylene] (MEH-PPV). A number of donor polymers with the right HOMO-LUMO bandgap have been developed to give absorption maxima overlapping with the maximum of the solar spectrum. (Shaheen, S. E. et al., Synth. Met. 121, 1583-1584, 2001, Brabec, C. J. et al., Adv. Funct. Mater., 12, 709-712, 2002, Smith, A. P. et al., Chem. Mater, 16, 4687-4692, 2004, Muhlbacher, D. et al., Adv. Mater, 18, 2884-2889, 2006). With respect to the acceptors, the soluble $C_{60}$ derivative [6-6]-phenyl C61-butyric acid methyl ester (PC60BM) is now widely used in OPV devices. The $C_{70}$ analog (PC70BM) has also been developed to improve the optical absorption coefficient. Currently, the most efficient OPV devices are the rr-P3AT/PCBM or rr-P3AT/PC(70)BM blends.

Electron-donor conjugated polymers are generally easier to design than electron-acceptor conjugated polymers. An electron-donor polymer can be created by appropriate introduction of an electro-negative heteroatom such as sulfur, nitrogen or oxygen into the conjugated polymer. A variety of chemistries are available for introducing electro-negative heteroatoms into such polymers. Therefore, a large number of p-type conducting polymers have been developed and characterized. Additionally, many p-type conducting and semi-conducting polymers have been used in commercial devices. They are successfully competing with conventional inorganic semiconductors and conductors.

It is more difficult to design electron-acceptor conjugated polymer systems. Currently, most of the polymers used as n-type semiconductors are hydrocarbon-based polymers such as poly(phenylenevinylene), carrying electron-withdrawing substituents such as cyano or nitro groups polymers containing oxadiazole, quinoxaline, or pyridine units, and a few ladder polymers such as BBL ({poly(7-oxo, 10H-benz[de]imidazo[4',5:5,6]-benzimidazo[2,1-a]isoquinoline-3,4:10,11-tetrayl)-10-carbonyl}). Unfortunately, current n-type semiconducting polymers have generally poor properties which include low charge carrier density and low carrier mobility. Additionally, most of these materials are difficult to process, and some of them are difficult to synthesize.

In some cases, n-type semiconducting non-polymeric species, such as functionalized fullerenes, molecular glasses and metal complexes, are used instead of polymers (Strohriegl, P. et. al., *Advanced Materials*, 14, 1439-1451, 2002; Shaheen, S. et. al., *Appl. Phys. Lett*, 78, 841-843, 2001). The disadvantage of these non-polymeric semiconducting species is the low charge carrier mobility due to the limited conjugation due to low molecular weight and the fact that they often need to be processed by vacuum deposition techniques. Particularly, fullerene derivatives have inherent shortcomings as a critical component in OPVs. A well-recognized problem is the low absorption coefficients of $C_{60}$ derivatives and to a lesser extent, $C_{70}$ derivatives in the solar spectrum. The problem itself is usually surmountable by tailoring the structure of the π-conjugated system, but in the case of fullerenes, their closed structures make such chemical modification very difficult.

There are two basic ways to produce a pi-conjugated polymer structure that is an electron acceptor. First, the conjugated backbone of the polymer can be chemically modified by substitution with electron withdrawing substituent groups. Pendant modification effectively imparts some electron affinity to the pi-conjugated polymer. As an example, poly(paraphenylene vinylene) has been modified with cyano and other pendant groups to produce a pi-conjugated semiconducting polymer with n-type properties. Another more effective way to impart n-type semiconducting properties is to directly modify the backbone of the polymer with electron affinity atoms or organic structures. Both the oxadiazole and quinooxaline structures are known to impart electron affinity in molecules. Pi-conjugated oxadiazole-containing polymers have been prepared that exhibited n-type semiconducting properties and photoluminescence. Pi-conjugated quinoxaline-containing polymers have also been prepared that also exhibited n-type semiconducting properties, photoluminescence, and electroluminescence. Pi-conjugated polymers incorporating regioregular dioctylbithiophene and bis(phenylquinoline) units in the backbone of the polymer have additionally been prepared and demonstrated both polymer light-emitting diodes (PLEDs) and organic field-effect transistors (OFETs) prototype devices utilizing these materials.

Due to the valence electronic structure of the boron atom and its ability to form multiple stable bonds with carbon atoms, certain non-polymeric, pi-conjugated, organoboron molecules have been observed to be electron acceptors (Nada, et al., *J. Am. Chem. Soc.*, 120, 9714-9715, 1998; Matsumi, et al., *Polymer Bulletin*, 50, 259-264, 2003). The empty p-orbital of boron can join in the pi-conjugated system without any added electron density. Mono- and di-vinylhaloboranes and trivinylborane have been extensively studied due to the possibility of delocalization of pi electrons between the vacant p orbital of boron and the pi orbitals of conjugated organic substituents. These molecules exist only in a planar conformation suggesting that there is delocalization of the vinyl pi electrons over the boron atom (Pelter, A., and Smith, K. "Triorganylboranes," in *Comprehensive Organometallic Chemistry*, Vol 3, 792-795, 1979). Theoretical calculations performed with the LCAO and self-consistent field methods (Good, C. D., and Ritter, D. M., *J. Am. Chem. Soc.*, 84, 1162-1165, 1962) as well as $^{13}$C-NMR studies (Yamamoto, Y. and Moritani I., *J. Org. Chem.*, 40, 3434-3437, 1975) also predict considerable delocalization of the vinyl pi electrons over the carbon-boron bonds. Three-coordinate boron species are reported to be equivalent to carbonium ions and are, therefore, extremely electron-deficient systems. Yet, if the boron is sterically protected with bulky trimethylphenyl groups, as an example, the resultant materials are air-stable (Marder et al., J. Solid State Chemistry, 154, 5-12, 2000). Low molecular weight, non-polymeric, pi-conjugated organoboron compounds are reported to have redox properties that are analogous to nitrogen-containing pi-conjugated molecules. In fact, under chemical or electrochemical reduction, organoboron compounds form a series of anions of the type: $—BR_2$, $—BR_2.^-$, $=BR_2^-$, while nitrogen-containing compounds upon oxidation form the series of cations: $—NR_2$, $—NR_2.^+$, $=NR_2^+$ (Fiedler et al., *Inorg. Chem.*, 35, 3039-3043, 1996) indicating that pi-conjugated organoboron compounds are redox active and are effectively easy to reduce. The use of certain organoboron, non-polymeric pi-conjugated molecules as an electron transport layer (ETL) in molecular organic light-emitting diodes has also been reported. They report an improvement in maximum luminescence by a factor of 1.6 to 1.8 compared to an identical single layer device that does not contain the organoboron. These organoboron ETL materials are non-polymeric molecules of defined structure having a specific molecular weight and are not pi-conjugated organoboron polymers.

Non-conjugated, organoboron polymers in which sterically bulky organic groups are appended to the boron atoms adjacent to the polymer chain have been reported. A number of pi-conjugated, organoboron polymers that make use of bulky protecting groups have been reported. These polymers have absorption maxima in the visible region and are highly fluorescent when irradiated with UV light which suggests the existence of an extended π-conjugation across the boron atoms. The polymers are also soluble in common organic solvents and stable in air and moisture in the pristine undoped state. Furthermore, the n-doping of a π-conjugated, organoboron polymer with triethylamine has achieved a conductivity of $10^{-6}$ S/cm. The n-type semiconducting properties and photoluminescence of these materials have been reported but were not shown to be useful in thin film, organic polymer electronic devices, such as OPVs, PLEDs, or OFETs.

There remains need for n-type semi-conductor materials which are suited to use in electronic devices and other applications where high electron affinities are desired.

INCORPORATION BY REFERENCE

The following references, the disclosures of which are incorporated herein by reference in their entireties, are mentioned:

U.S. Patent Application No. 20070215864 A1, entitled USE OF PI-CONJUGATED ORGANOBORON POLYMERS IN THIN-FILM ORGANIC POLYMER ELECTRONIC DEVICES, by Luebban, et al., discloses the use of pi-conjugated (or π-conjugated) organoboron polymers in thin film electronic devices and methods for the fabrication of such devices.

U.S. Pat. No. 6,025,453 discloses polymers containing at least an alkynyl group, at least one silyl group and at least one boranyl group and their use for making high temperature oxidatively stable thermosetting plastics.

The preparation of certain organoboron polymers is disclosed in U.S. Pat. Nos. 3,269,992, 3,203,909, 3,203,930, 3,203,929, 3,166,522, and 3,109,031.

BRIEF DESCRIPTION

In accordance with one aspect of the exemplary embodiment, an n-type conjugated polymer is provided. The n-type conjugated polymer includes at least one conjugated electron-acceptor unit. The at least one conjugated electron-acceptor unit includes a cyclic diborylene unit.

In accordance with another aspect, a method for forming an n-type conjugated polymer includes polymerizing a monomer having the general structure:

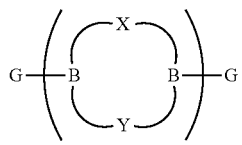

Structure 1 wherein B is a boron atom, X and Y are independently selected from π-conjugated groups and p-conjugated atoms and each G is independently a halide or hydrogen.

In accordance with another aspect, an electronic device includes a layer comprising an n-type conjugated compound comprising a diborylene unit.

DETAILED DESCRIPTION

Figure 1:
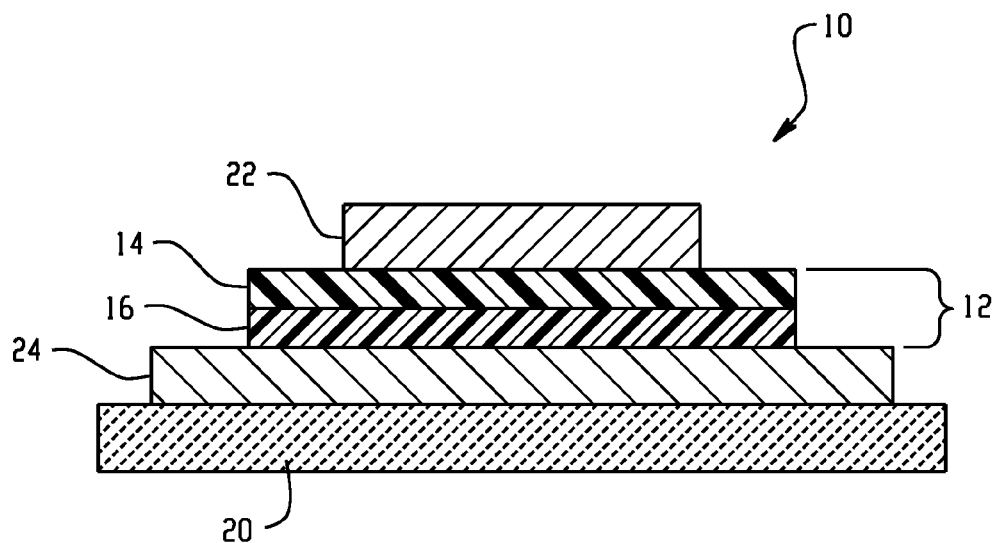
FIG. 1 is a side sectional view of a planar heterojunction organic photovoltaic cell containing a layer of a n-type conjugated polymer in accordance with one aspect of the exemplary embodiment.

Aspects of the exemplary embodiment relate to n-typed conjugated compounds (monomers, oligomers and polymers), a method of synthesis, and an electronic device comprising the compound, such as an OPV cell. The n-type conjugated polymer includes at least one anti-aromatic, highly electron accepting di-borylene unit in its main chain or backbone. With this structure incorporated into the backbone, the n-type conjugated polymer can have electron affinities comparable to $C_{60}$. It can, therefore, find application in photovoltaic cells and other like applications.

In comparison to the fullerene derivatives, the conjugated polymers disclosed herein have several advantages. The optical absorption window can be readily controlled. Their absorption coefficients are usually high and the improvement of electron mobility can be achieved by tailoring the molecular structure. Additionally, the exciton binding energies of the disclosed conjugated polymers are usually a small fraction of those of conjugated small molecules. Additionally, donor-acceptor block copolymers can be synthesized which incorporate the polymer as an acceptor block together with a donor block.

In one embodiment, the n-type conjugated compound includes one or more cyclic diborylene units, which serve as electron-acceptors. Each diborylene unit includes two boron atoms in a ring. The ring may be at least a five-membered ring, such as a five, six or seven membered ring. The boron atoms are spaced, in the ring, by π-conjugated groups or p-conjugated atoms. The diborylene unit may have the general structure of Structure 2:

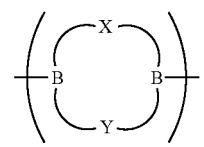

Structure 2 wherein B is a boron atom, X and Y are independently selected from π-conjugated groups and p-conjugated atoms. The links between the atoms indicate that additional ring members may be present.

The p-conjugated atom, where present, can be selected from sulfur, oxygen and nitrogen-$R_0$ wherein $R_0$ can be selected from H, and $C_1$ to $C_{30}$ alkyl, aromatic hydrocarbon (e.g., phenyl) or heterocyclic groups, and substituted derivatives and combinations thereof. In a five-membered ring, at least one of X and Y may be a π-conjugated group. The π-conjugated groups can be selected from aromatic groups which may include a substituent, and alkylene groups which provide the ring with a carbon-carbon double or triple bond and which may be substituted or unsubstituted. The π-conjugated groups, where present, each provide two of the ring members.

Exemplary diborylene units include Structures 3, 4, 5, 6, 7, 8, and 9:

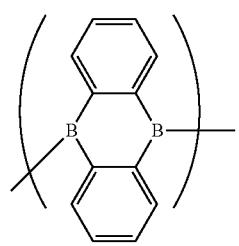

Structure 3

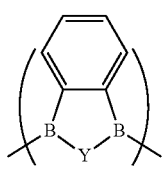

Structure 4

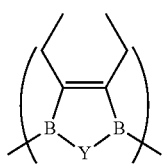

Structure 5

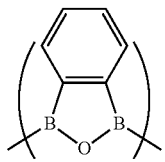

Structure 6

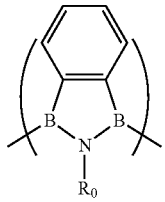

Structure 7

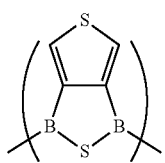

Structure 8

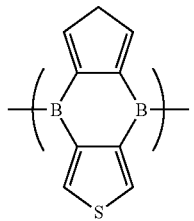

Structure 9 wherein each Y is selected from S, O and N—$R_0$ wherein $R_0$ can be H, a $C_1$ to $C_{30}$ alkyl group, an aromatic hydrocarbon or a heterocyclic group and substituted derivatives and combinations thereof.

The exemplary monomer, oligomer or polymer includes at least one diborylene unit as described above.

Exemplary monomers may have the general structure:

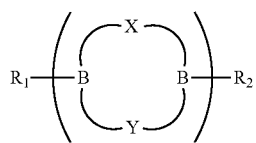

Structure 10 wherein $R_1$ and $R_2$ can independently be, for example, H, a halide, or an alkyl group, such as a $C_1$ to $C_{30}$ alkyl group.

In another embodiment, the n-type conjugated compound is an oligomer or polymer comprising a plurality of diborylene units. The exemplary n-type conjugated polymer may be a copolymer comprising diborylene units as described above, and—optional conjugated linkage groups. The exemplary copolymer may have the general formula:

Structure 11 where A is a diborylene unit as described above and L is a conjugated linkage unit, x, y, and n are integers, where $x \geq 1$, $y \geq 0$, and $n \geq 1$. In one embodiment, x is 1 and y is 1. In one embodiment, $n>1$, e.g., $n \geq 10$. n can be for example, less than about 1,000, such as up to about 50, e.g., about 20-30. y can be up to about 10. In one embodiment, each A is the same and each L is the same to provide a regular repeating structure. As will be appreciated, Structure 11 may be terminated at either end with $R_1$ and $R_2$, as described above, or other endcapping groups or incorporated into a copolymer as described in further detail below.

The optional-conjugated linkage unit L can be, for example, an aromatic group, vinylene, ethynylene, 1,3-butadienylene, or other divalent radicals containing more than one conjugated carbon-carbon double bond, carbon carbon-triple bond, carbon-heteroatom double bond, carbon heteroatom triple bond, and mixtures, thereof. Other exemplary linkage units L are shown in Structures 12, 13, 14, and 15.

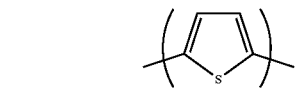

Structure 12

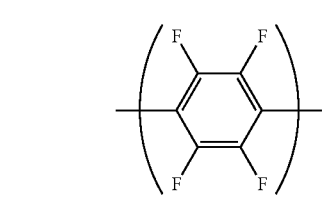

Structure 13

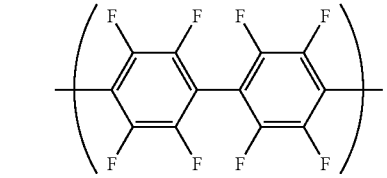

Structure 14

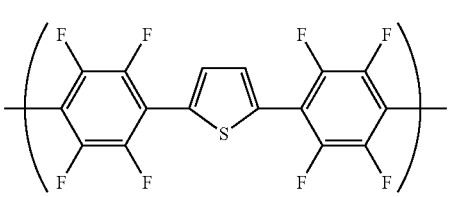

Structure 15

Exemplary polymers in accordance with Structure 11 are shown in Structures 16, 17, 18, 19, 20 and 21. As will be appreciated, the sulfur group in Structures 17, 18, 20 and 21 may be replaced with other Y groups as defined above. Also, the linkage groups shown are interchangeable with other linkage groups.

Structure 16
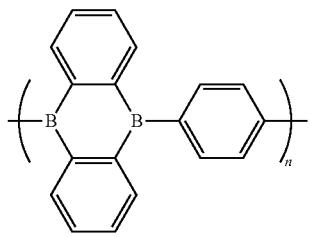

Structure 17
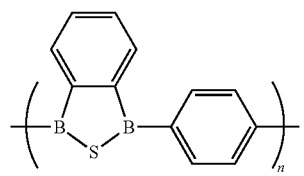

Structure 18
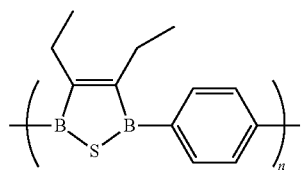

Structure 19
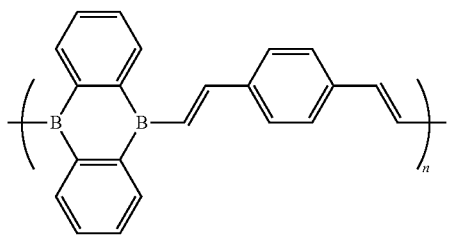

Structure 20
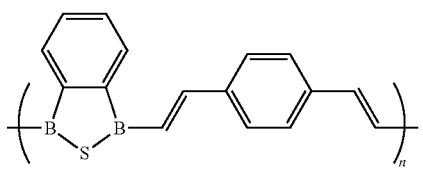

Structure 21
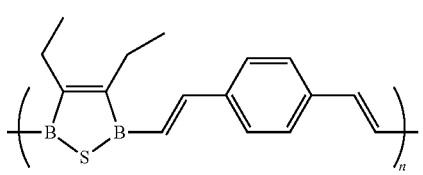

The exemplary copolymer can have exceptionally high electron affinities. With these structures incorporated into the backbone, the π-conjugated polymers (e.g., Structures 16, 17, 18, 19, 20, and 21) may have electron affinities comparable to or better than that of $C_{60}$. Additionally, such n-type conjugated polymers possess characteristics for achieving high electron mobility and device stability. These characteristics include stability after electrochemical reduction, the potential for strong intermolecular interaction, and the planar molecular shape that induces the crystalline morphology. Furthermore, the n-type conjugated polymers can be processed without compromising other attributes due to their Lewis acidity.

As used herein, a copolymer is a polymer derived from two or more monomeric species, in contrast to a homopolymer where only one monomer is used. Copolymerization refers to methods used to synthesize a copolymer. Optionally, the n-type conjugate polymer made up of A and L units serve as one block of a block copolymer with an optional spacer unit C, wherein a second block comprises electron donor units D, as shown in Structure 22:

Structure 22
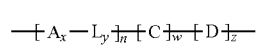

wherein A and L are as previously described and D is an optional electron-donor unit. The electron donor unit D, where present is optionally spaced from the electron acceptor (AL) block by an alkyl spacer unit C, x, y and n are as previously described, w and z are integers, where $w \geq 0$ and $z \geq 0$. z may be for example, at least 10, and in some embodiments may be up to about 1,000. In some embodiments, $w \geq 1$. In other embodiments, electron accepting (AL) blocks form the terminal blocks. As will be appreciated, when w is 0 and z is 0 this reduces to structure 11 above.

Exemplary aromatic electron-donor units D are divalent radicals generated by the removal of two hydrogen atoms from benzene, such as 1,4 phenylene, 1,3-phenylene, and 1,2-phenylene, naphthalene, diphenyl, pyridine, pyrimidine, triazine, pyrrole, N-alkylpyrroles, N-substituted pyrroles, 3-substituted pyrroles, furan, tetrazole, indole, purine, oxadiazole, 1,5-diphenyl-oxadiazole, quinoxaline, phenazine, N,N'-dialkylphenazines, phenothiazine, N-alkylphenothiazines, carbazole, N-alkylcarbazoles, thiophene, 3-alkyithiophenes, 3-substituted thiophenes, 3,4-disubstituted thiophenes, thienothiophene, substituted thienothiophenes, bithiophene, terthiophene, quaterthiophene, dialkyloxybenzenes, oxazole, fluorene, 9,9-dialkylfluorenes and their substituted derivatives. Additionally, the aromatic fragments may be oligomeric species containing one or more of the repeating unit listed above and their mixtures. Exemplary aromatic donor units D are shown in Structures 23, 24, and 25.

Structure 23
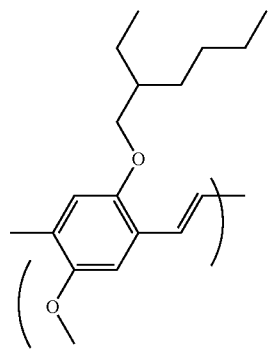

poly[2-methoxy,5-(2'-ethyl-hexyloxy)-p-phenylene-vinylene]
MEH-PPV

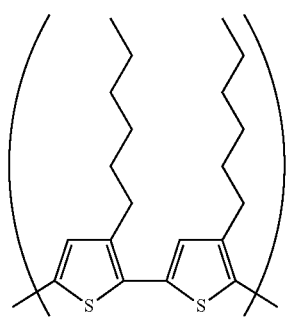

Poly (hexyl-thiophene) n-P3HT

Structure 24

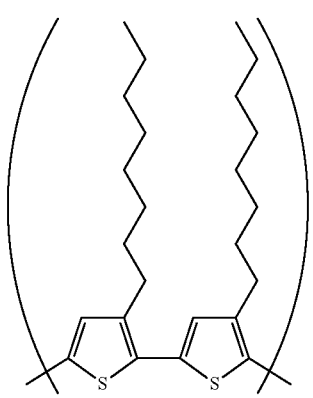

Poly (octyl-thiophene) n-P3OT

Structure 25

The non-conjugated spacer unit C, where present can be, for example, a $C_2$ to $C_{30}$ alkyl group, having the general formula: $C_tH_{2t+1}$, wherein $t \geq 1$.

Electron Affinity

The exemplary diborylenes disclosed herein have considerably higher electron affinities than the arylborylenes previously incorporated into conjugated polymers and oligomers. Table 1 shows the available reduction half-wave potentials ($E_{1/2}$) of exemplary diborylene monomers. $E_{1/2}$ values of conventional boranes and [6,6]-phenyl-$C_{61}$-butyric acid methyl ester (PCBM) are provided for comparison. The values are referenced versus the SCE potential. The values indicate the embodiments of Structures 26 (1-I) and 27 (1-Me) are reduced at the most positive potential. The $E_{1/2}$ of 1-Me is more positive, even though the methyl groups do not contribute to π-electron delocalization and are electron-donating. The cyclic diborylene embodiments significantly lower the LUMOs of the conjugated systems compared to the acyclic topologies in the comparative Structures 29 and 30.

TABLE 1

Comparison of reduction half wave potentials of boranes.

| Structure | Short Name | $E_{1/2}$ (V) |
|---|---|---|
| Structure 26 | 1-I | −0.45 |
| Structure 27 | 1-Me | −1.14 |
| Comparative Structure 28 | | −1.20 |
| Comparative Structure 29 | | −1.39 |
| Comparative Structure 30 | | −1.80 |
| PCBM | | −0.63 |

Table 2 shows calculations at the Gaussian B3LYP/6-31G* level for three exemplary diborylene monomers: Structures 31 (1-H), 32 (2-H), and 33 (3-H). The molecular orbital energies for the exemplary diborylene monomers are computable by optimizing the molecular structure of a compound using quantum-chemistry program Gaussian 98. As the quantum-chemistry calculator method, semi-empirical and nonempirical molecular orbital methods, etc. can be used (see *J. Chem. Phys.*, 98, 5648 1993). The calculations show that the LUMOs of 2-H and 3-H lie at comparable or lower levels than 1-H. Using −0.63 $E_{1/2}$ of PCBM as a reference, qualifies the electron acceptor structures Structures 16, 17, 18, 19, 20, and 21 as being particularly suitable for use in for photovoltaic devices. The high electron affinity is desirable for electron transfer at the heterojunction and for the interchain charge-hopping process where charge transport is severely limited. The reduction potential of n-type conjugated polymers is desirably at least 0-0.5 V vs SCE to achieve device stability to oxygen.

closed herein are advantageous for effective intermolecular π-stacking and for the formation of crystalline morphology. In comparison, the phenyl groups of triphenyl boron arrange themselves in a propeller-like geometry that hinders intermolecular alignment. A further increase in steric bulk required for the reversible electrochemical reduction of the acyclic arylboranes can be expected to further weaken the intermolecular interactions.

X-ray crystallography suggests a dimeric structure in the solid state for 3-I, as shown in Structure 34.

TABLE 2

Calculated molecular orbital energies of model diborylene compounds.

|  | Structure 31 Short Name 1-H | Structure 32 Short Name 2-H | Structure 33 Short Name 3-H |
|---|---|---|---|
| LUMO (eV) | −2.846 | −2.934 | −2.990 |
| HOMO (eV) | −6.895 | −7.029 | −6.726 |
| Energy Gap (eV) | 4.049 | 4.095 | 3.736 |

OPV processing typically requires that conventional electron accepting polymers are processed in an inert atmosphere, such as in a glove box, where both water and oxygen are excluded. The exemplary polymers are stable in polar liquids, water or other aqueous environments. Thus, processing the exemplary compounds to form a device may be carried out in environments where water is not excluded. To avoid subsequent damage by oxygen, the polymer can be confined between layers of other materials.

Stability of Radical Anion

In the present embodiment, the electrochemical reduction of 1-Me (Structure 27) is reversible. The radical anion [1-Me].⁻ and the aromatic dianion [1-Me]²⁻ can be isolated in the form of [K(THF)₂(18-crown-6)]⁺ salts. The radical anion [1-Me].⁻ through crystallography is characterized as having a planar structure with four equivalent boron-carbon bonds which indicates a fully delocalized radical anion. In comparison, the electrochemical reduction of acyclic triarylboranes have been found not to be reversible unless at least one bulky aryl group, such as mesityl, is present. The chemical stability of the exemplary radical anion has two significant implications to OPV application. The first is the absence of chemical decomposition, which is advantageous for long device lifetime. The second is the reversible electrochemical reduction for facilitating interchain electron hopping and thus high electron mobility.

Intermolecular Interactions

In the present embodiment, the rigid planar molecular structures 1-H, 2-H and 3-H (Structures 31, 32 and 33) and corresponding diborylene units of exemplary polymers dis-

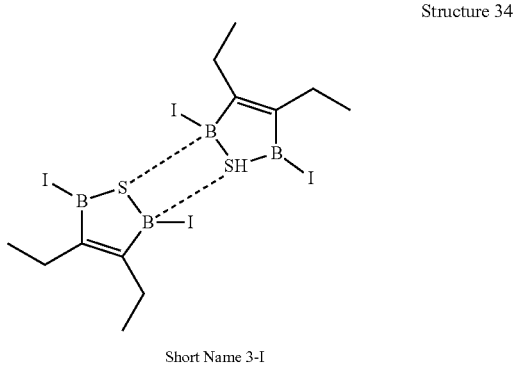

Structure 34

Short Name 3-I

This solid state arrangement may stack the polymer chains and promote charge hopping by bringing the chains close together.

It is known that strong intermolecular interactions and an ordered crystalline solid-state morphology are highly favorable for achieving high electron mobility. The structural rigidity and high crystallinity of the exemplary n-type conjugated compounds should additionally benefit the device stability by limiting the mobility of the atoms in the solid state and increasing the energetic barriers for chemical reactions. Functional groups such as carbon-carbon double bonds, which could otherwise damage the device lifetime by undergoing photo-cycloadditions, may be inert if trapped in certain conformations in a crystalline phase.

Processability

While highly crystalline, rigid polymers are often insoluble in common solvents and lack processability, in boron-containing Lewis acidic polymers, such as the n-type conjugated polymers disclosed herein, the coordination of solubilizing Lewis bases with the polymer can render the polymers soluble. The dissolved polymer in solution can thus be readily applied as a film. The Lewis base can be removed by an annealing step after processing. A Lewis base includes an electron-donor pair. Exemplary Lewis bases which can be used for coordinating with the exemplary polymers during processing to render them soluble in solvents such as toluene/heptane, include, for example, diglyme, dimethyl-formamide (DMF), methyl tert-butyl ether (MBE) and tetrahydrofuran (THF).

Optical Absorption

In the present embodiment, 1-Me (Structure 27) and the methyl derivative of 2-H (Structure 32) are colorless, while the methyl derivative of 3-H (Structure 33) is yellow brown with absorption at about 4,000,500 nm. Red-shifts of the polymers from the respective monomeric molecules can be expected to be <100 nm. To obtain an absorption in the long-wavelength region of the electromagnetic spectrum, extended π-conjugated chromophores, e. g., acenes, or other absorption mechanisms can be introduced to the compositions using a method described, for example, in Roncali, J., *Chem. Rev.*, 97, 173-205, 1997.

Methods for Forming the Exemplary Polymer

In one embodiment, a method of forming an n-type conjugated polymer includes polymerizing a monomer unit having the general Structure 1 with a reagent for providing the linking unit:

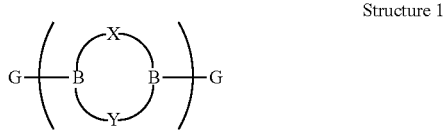

Structure 1 where P is a boron, G is a halide, such as fluoride or iodide or hydrogen; and X and Y are independently selected from a π-conjugated group and a p-conjugated atom, as previously defined.

An exemplary method proceeds as follows: Dihalide monomers based on Structures 3, 4, or 5 can be synthesized according to the methods of Bieller, S et al., *Organometallics*, 23, 2107-2113, 2004; Asgarouladi, B., *Chem. Ber.*, 107, 34-47, 1974; or Siebert, W., *Chem. Ber.*, 111, 823-831, 1978. The copolymer can be formed by nucleophilic substitution or hydroboration of the dihalide with a reagent for forming the linking unit. Exemplary nucleophilic reagents include, carbon, oxygen, sulfur, and nitrogen nucleophiles, such as, ditin compounds, alkyl metal halides, water, alcohols, thiols, ammonia, azides and amines. An exemplary hyboration reagent is a solution of tricholorborane and triethylsilane.

The copolymerization reaction can be performed in a suitable solvent, such as toluene/heptane. To render the monomer soluble in the solvent, it may be first combined with a Lewis base, such as, for example, diglyme, dimethyl-formamide (DMF), methyl tert-butyl ether (MBE) and tetrahydrofuran (THF) and combinations thereof.

Following polymerization, an end-capping step may be applied to prevent further chain growth. A reactive end group, such as phenylacetylene or trimethyl stannyl, can be used for the endcapping. The reactive group can also be utilized for the synthesis of donor-acceptor block copolymers.

Electronic Devices Comprising the Compound

In another embodiment, an electronic device includes at least one n-type conjugated compound (monomer, oligomer, or polymer) as disclosed herein. In particular, the electronic device includes an n-type conjugated polymer. The polymer may be in the form of a thin layer of a thin-film organic polymer electronic device. The layer may comprise, for example, from 0.1-100% by weight of the n-type conjugated polymer and in some embodiments, at least 1% or at least 10% by weight.

The n-type conjugated polymers in the device generally contain diborylene units in the polymer backbone and may exhibit one or more of the following properties: n-type semiconducting properties, photoluminescence, and electroluminescence.

The thin film comprising the n-type polymer may be a continuous stratum that is between about 0.1 nanometer and 100 micrometers in thickness, and can be, for example, 10 nanometers to 100 micrometers thick.

In one embodiment, the thin-film, organic electronic device includes an active layer which includes at least one thin-film comprising the n-type polymer. The active layer is contact with two of more conducting materials acting as electrodes to which a current or voltage is applied or from which a current or voltage is obtained. Examples of thin-film organic electronic devices include, but are not limited to, OPVs, LEDs and FETs. When the device is turned on, the active layer exchanges charge carriers with one or more of the electrodes.

The n-type polymer in the active layer may be in the form of a block copolymer comprising electron donor units D as described above. In other embodiments, the n-type polymer serves solely the electron acceptor and a separate polymer may serve as an electron donor.

In one embodiment, the active layer comprises a thin film of the exemplary n-type conjugated monomer including diborylene units. In another embodiment, the active layer comprises a thin-film of the exemplary n-type conjugated polymer including diborylene units. In another embodiment, the active layer comprises a thin-film made of a blend or mixture of materials, at least one of which is the exemplary n-type conjugated polymer. In yet another embodiment, the active layer of the device comprises two or more thin films of semiconducting materials at least one of which is the exemplary n-type conjugated polymer or a blend containing the exemplary n-type conjugated polymer. When two or more thin-films are present in the active layer, these thin-films are in contact with any adjacent thin-films and/or electrodes.

FIG. 1 schematically illustrates an electronic device in the form of a planar heterojunction organic photovoltaic (OPV) cell 10, by way of example. The cell 10 includes an active layer 12 which includes a first layer 14 including the exemplary n-type conjugated polymer as an electron-acceptor, and a second layer 16, in contact with the first layer, which includes an electron-donor. In the illustrated embodiment, layers 14 and 16 are substantially coextensive. The electron donor can be, for example, a polymer as described for block D of the block copolymer. This device configuration may include a substrate 20, such as a layer of glass, ceramic, plastic, paper, textile, or metal which serves to support the device. The active layer 12 separates first and second electrodes 22, 24. Exemplary electrode materials include metals, metal oxides, semiconductors, conducting polymers, semiconducting polymers or mixtures thereof.

Figure 2:
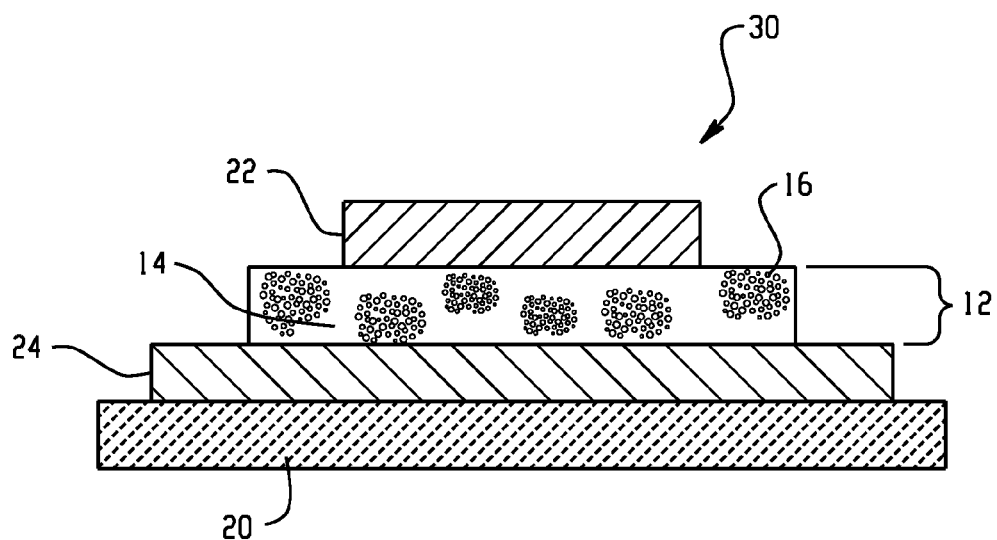
FIG. 2 is a side sectional view of a bulk heterojunction organic photovoltaic cell containing a layer of the n-type conjugated polymer in accordance with another aspect of the exemplary embodiment.

FIG. 2 schematically illustrates another electronic device 30 in the form of a bulk heterojunction organic photovoltaic (OPV) cell, where similar elements are accorded the same numerals. The active layer 12 includes the exemplary n-type conjugated polymer matrix 14 as an electron-acceptor in which an n-type conjugated polymer that is an electron-donor is dispersed as particles 16 (or vice versa). The active layer separates the two electrodes 22, 24 and may be supported on a substrate 20.

Figure 3:
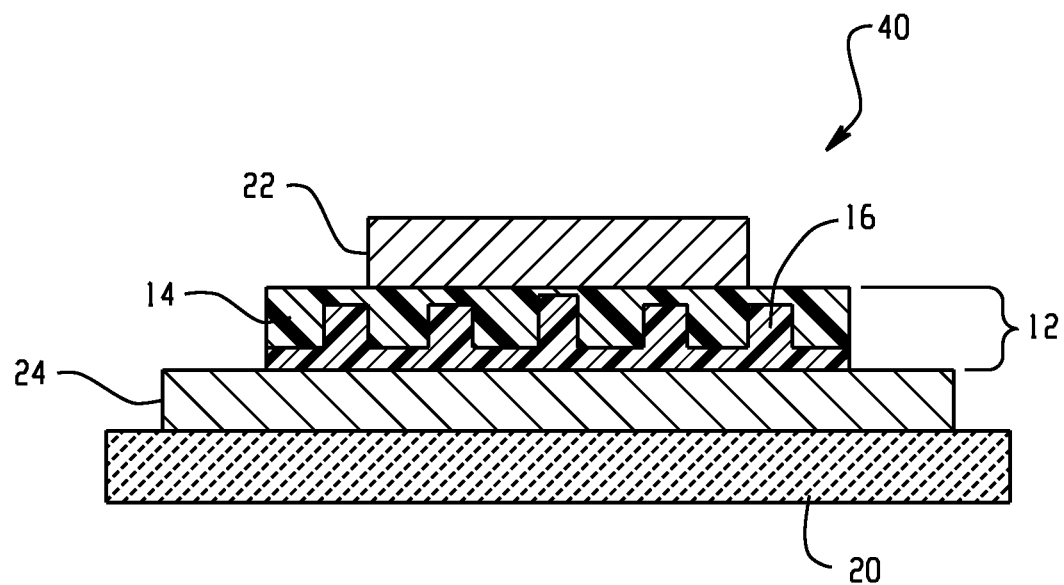
FIG. 3 is a side sectional view of an ordered bulk organic photovoltaic cell containing a layer of the n-type conjugated polymer in accordance with another aspect of the exemplary embodiment.

FIG. 3 schematically illustrates another electronic device 40 in the form of an ordered bulk heterojunction organic photovoltaic (OPV) cell, where similar elements are accorded the same numerals. In this embodiment, the first and second active layers 14, 16 are interdigitated to increase contact between them.

Figure 4:
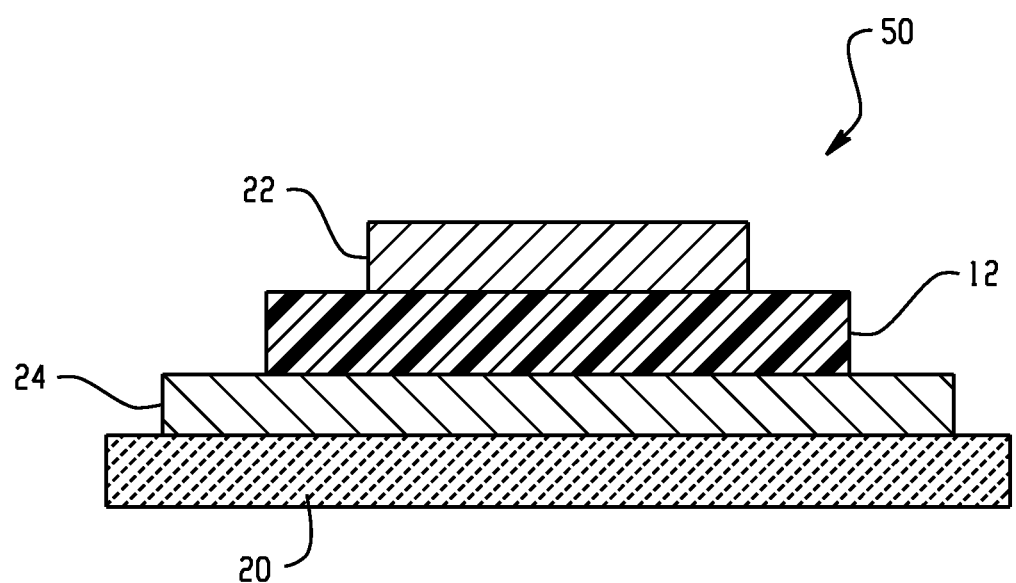
FIG. 4 is a side sectional view of an organic light emitting diode (OLED) containing a layer of the n-type conjugated polymer in accordance with another aspect of the exemplary embodiment.

FIG. 4 schematically illustrates another electronic device 50 in the form of an organic light emitting diode (OLED) in which the active layer 12 is a light-emitting polymer layer which includes an n-type conjugated polymer in accordance with the exemplary embodiment which is light emitting. In this embodiment, the n-type polymer may constitute at least about 10% by weight of the active layer and in one embodiment, up to 100% by weight of the active layer.

Figure 5:
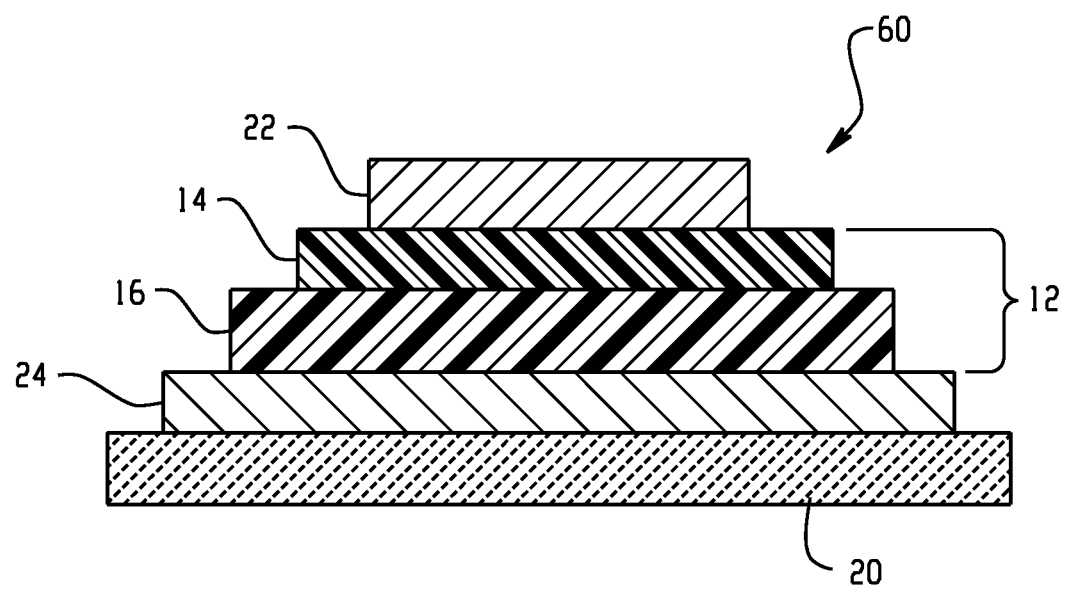
FIG. 5 is a side sectional view of an organic light emitting diode (OLED)—electron transport layer (ETL) containing a layer of the n-type conjugated polymer in accordance with another aspect of the exemplary embodiment.

FIG. 5 schematically illustrates another electronic device 60 in the form of an organic light emitting diode (OLED) having an electron transport layer (ETL). In this embodiment, the active layer 12 includes an electron transfer layer (n-type) 14 which includes the n-type conjugated polymer, and a light emitting polymer (LEP) layer 16 comprising a light-emitting species, e. g., a light emitting polymer. This polymer may or may not be an n-type conjugated polymer.

Figure 6:
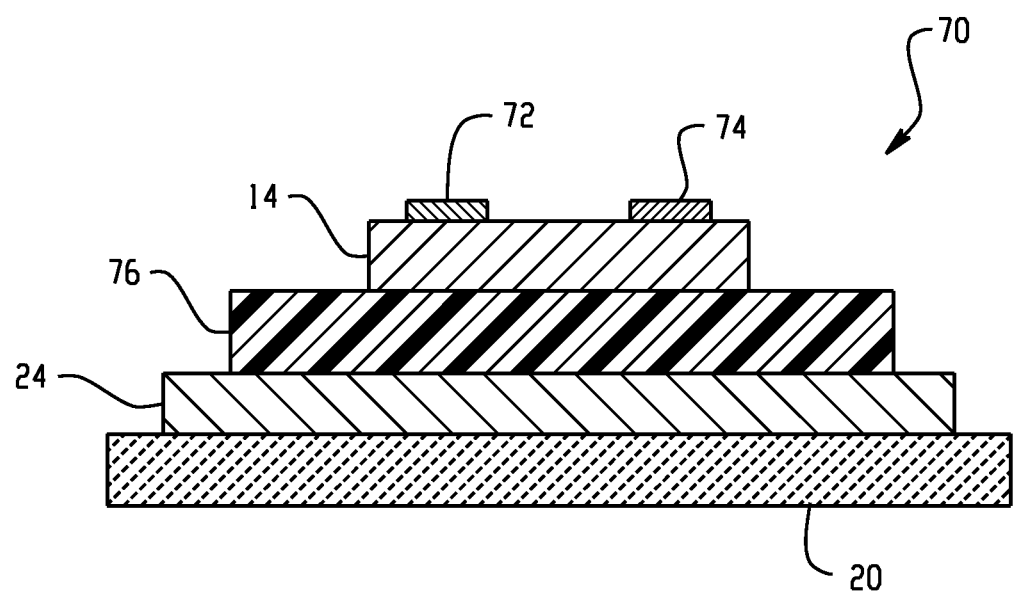
FIG. 6 is a side sectional view of an organic field effect transistor with a bottom gate containing a layer of the n-type conjugated polymer in accordance with another aspect of the exemplary embodiment.

FIG. 6 schematically illustrates another electronic device 70 in the form of an organic field effect transistor (bottom gate variety) in which the active layer 12 is positioned between a bottom electrode 24 and two separate top electrodes 72, 74. The active layer includes a dielectric layer 76 adjacent the bottom electrode and a layer 14 which includes the n-type conjugated polymer, which layer 14 spaces the dielectric layer 76 from the top electrodes and is in contact therewith.

Figure 7:
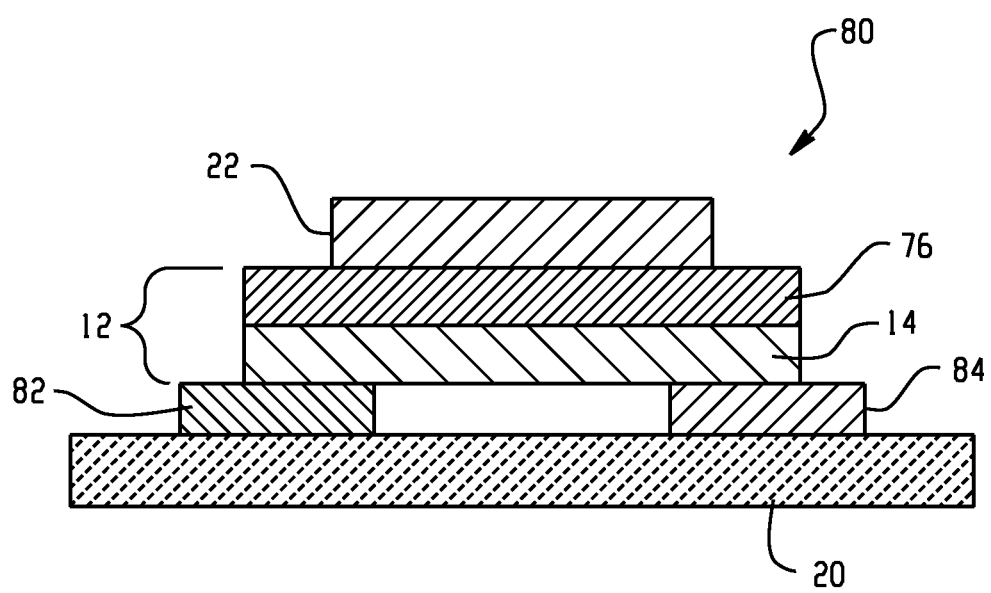
FIG. 7 is a side sectional view of an organic field effect transistor with a top gate containing a layer of a n-type conjugated polymer in accordance with another aspect of the exemplary embodiment.

FIG. 7 schematically illustrates another electronic device 80 in the form of an organic field effect transistor (top gate variety) in which the active layer 12, a combination of layers 14 and 76, is positioned between the top electrode 22 and two separate bottom electrodes 82, 84. Dielectric layer 76 is adjacent the top electrode and the n-type conjugated polymer comprising layer 14 is between the dielectric layer 76 and in contact with the bottom electrodes 82, 84.

The exemplary electronic devices may be formed by thin film deposition techniques.

Figure 10:
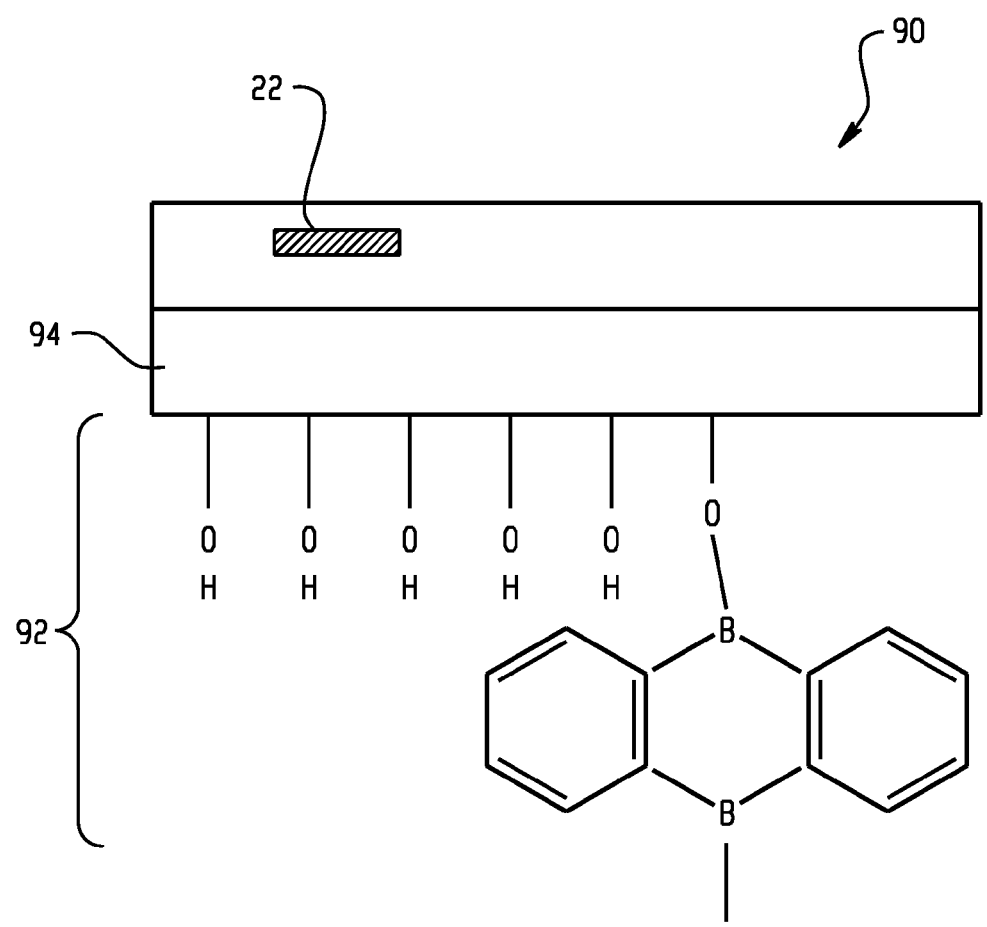
FIG. 10 illustrates a method of providing a monolayer of n-type conjugated monomer in accordance with another aspect of the exemplary embodiment.

In another embodiment, rather than using the polymer, a layer of an electronic device may be formed of the monomer (e.g., Structure 26 or Structure 27) or short chain oligomer, through covalent attachment to an electrode or other layer of the electronic device. The resulting self-assembled monolayer (or very thin layer) can be covered with one or more additional layer(s) to complete the formation of the device. As an example, an electronic device in the form of an organic field effect transistor (of gate variety) 90 includes an active layer 92 which is a self assembled monolayer of the n-type monomer. The layer serves as an electron acceptor or electron hole blocker. In this embodiment, the n-type monomer is covalently attached to a hydroxyl-terminated aluminum cathode 94 of an indium tin oxide (ITO) electrode 22, as illustrated in FIG. 10.

Without intending to limit the scope of the exemplary embodiment, the following examples illustrate methods for forming the exemplary n-type conjugated polymers disclosed herein.

EXAMPLES

Example I

Proposed Synthesis of poly(diborylene-phenylenes) by Nucleophilic Substitution

Diborylene monomers in the form of dihalides (e.g., Structure 35) can be synthesized according to the method of Bieller, S et al., *Organometallics*, 23, 2107-2113, 2004; Asgarouladi, B., *Chem. Ber.*, 107, 34-47, 1974; or Siebert, W., *Chem. Ber.*, 111, 823-831, 1978). Poly(diborylene-phenylenes) are then prepared by nucleophilic substitution of the dihalides with reagents such as trimethyl(phenyl)tin (Structure 36) in step A of Scheme 1, below. Following polymerization, an end-capping step can be applied to prevent the unintended chain growth during structural characterization (step B). The end-capping is a separate step since the polymer may likely precipitate out from the reaction mixture before a high extent of reaction of the step growth polymerization can be reached.

Scheme 1: Proposed synthesis of poly(diborylene-phenylenes)

Step A

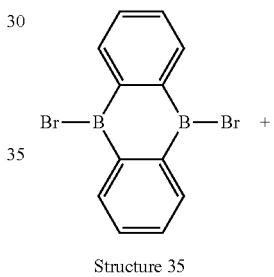

Structure 35

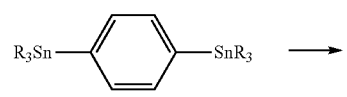

($R_3 = {}^nBu$ or Me)
Structure 36

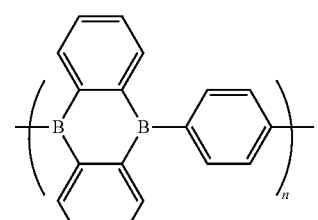

Structure 37

Step B

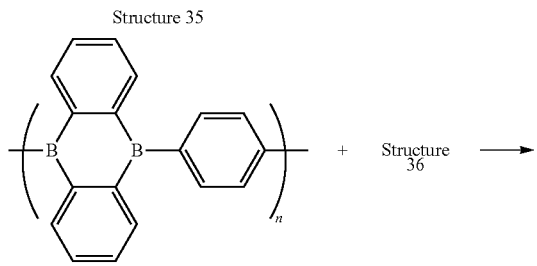

Structure 38
Short Name 1-SnMe₃

Example II

Proposed Synthesis of poly(diborylene-phenylenedivinylenes) by Hydroboration

Poly(diborylene-phenylenedivinylenes) can be prepared via hydroboration reaction as shown in Scheme 2. Monomer structures (e.g., Structure 39) are prepared by reaction of the corresponding dihalide with triethylsilane (Aylett, B. J., *Adv. Inorg. Chem. Radiochem.*, 11, 249-307, 1968, Corriu, R. J. P., et al., *Chem. Commun.*, 963-964 1998). Anti-Markovnikov cis-addition is the result for the hydroboration polymerization with triethylsilane. After polymerization, the resulting polymer is end-capped with phenylacetylene. The possibility for the structure hydrides to add to the C=C bonds in the polymer is very low.

Scheme 2: Synthesis of poly(diborylene-phenylenedivinylenes)

Step A

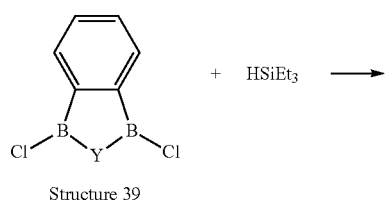

Structure 39

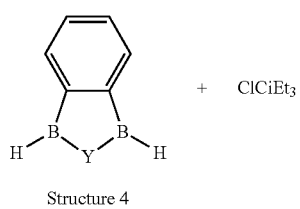

Structure 4

Step B

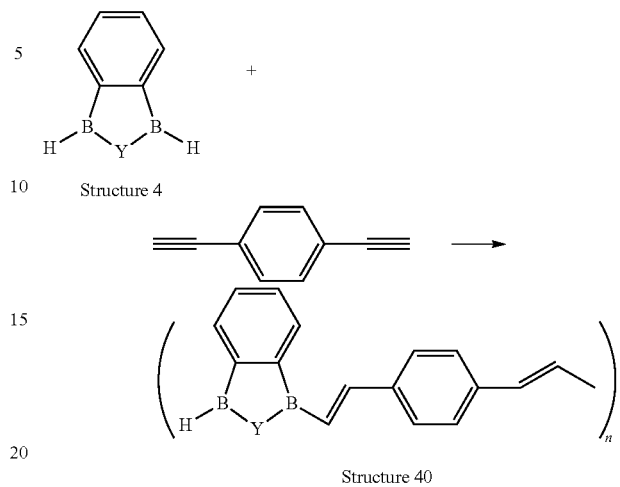

Structure 40 where Y and n are as previously described.

However, if there is an chance that the double hydroboration cannot be avoided, transmetallation as in Scheme 3 can be used to obtain the corresponding polymer followed by end capping.

Scheme 3

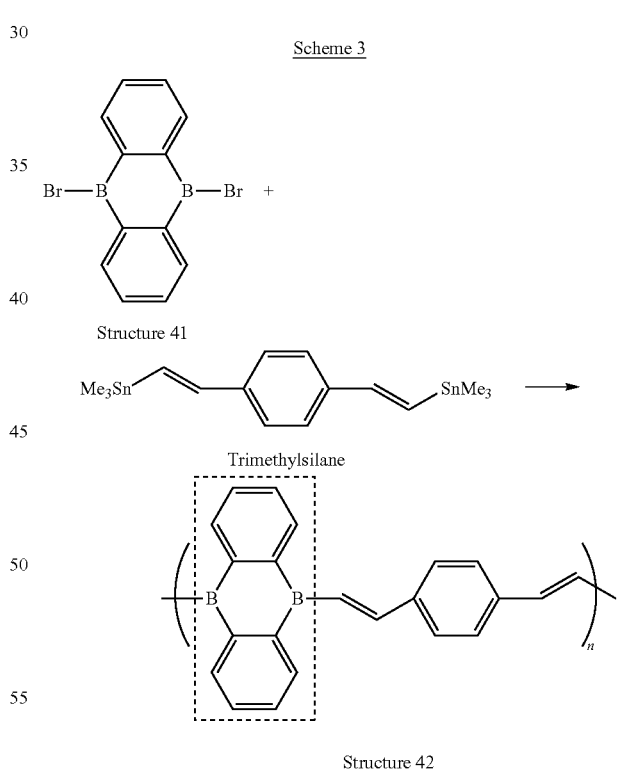

Structure 42

Characterization

The chemical structures of the exemplary polymers can be characterized using routine $^1H$, $^{13}C$, and $^{11}B$ NMR spectroscopic techniques. End group analysis by $^1H$ NMR spectroscopy can be used to determine the number average molecular weight. Gel permeation chromatography (GPC) and matrix assisted laser desorption mass spectrometry (MALDI MS) may be used for the characterization of arylborylene-containing polymers (Kobayashi, H. et al., *Synthetic Metals*, 135-136, 393-394, 2003). Otherwise, GPC under an inert atmosphere using anhydrous solvents can be used.

Cyclic voltammetric (CV) under nitrogen can be performed. Platinum electrodes can be used as working and counter electrodes, a silver wire as the quasi-reference electrode, and $[N(^nBu)_4]^+[PF_6]^-$ as the electrolyte. The quasi-reference electrode can be calibrated with the ferrocene/ferrocenium redox couple, the potential of which is at 0.52 V vs. SCE in THF (Enemaerke, R. J. et al., *Chem. Commun.*, 343-344, 1999). The working electrode and its plastic cladding render a flat area large enough for drop casting of thin films. In cases where the polymer film does not adhere to the platinum electrode, glassy carbon electrodes or ITO electrodes can be utilized.

The optical absorption can be measured in the solution phase and in the solid thin film state. The change of optical absorption with thermal and vacuum annealing of the film can be investigated. The photoluminescent spectra of the structures and rr-P3HT, and their blends at various weight ratios can be measured.

Wide-angle X-ray diffraction was used to determine the crystallinity of the polymers. The morphological change with thermal and vacuum annealing can be studied.

Differential scanning calorimetry can be performed to characterize the phase transitions and thermal decomposition. The studies can be performed in air and under nitrogen. Thermogravimetric analysis is also particularly useful for investigation of the Lewis base dissociation from the solid state.

Example III

Synthesis of Polymer Structure 38 (1-SnMe$_3$)

Structure 37 (1-SnMe$_3$) was synthesized by first stirring Structure 31 (1-Br) and trimethyl(phenyl)tin (Structure 36) in 1:1 stoichiometry in refluxing toluene for 6 h followed by treating the off-white precipitate with excess trimethyl(phenyl)tin (Structure 36) in refluxing toluene for an additional 12 h. Polymer 1-SnMe$_3$ (Structure 37) is not soluble in aromatic or chlorinated solvents but is soluble in THF and very soluble in DMF. The structure of Structure 37 was characterized by $^1$H, $^{13}$C, and B$^{11}$ NMR spectroscopic techniques. The number average degree of polymerization is 42 (n=21) according to end group analysis. Polymer 1-SnMe$_3$ (Structure 34) appears to lose THF rather easily. Evacuation for 1 hour after removal of THF from the solution left a substoichiometric amount of THF in the solid according to $^1$H NMR spectroscopy in DMF-d$_7$. Further heating at 60° C. under 1 atm for 12 h completely removed THF.

Using characterization techniques as described above, the chemical structure of Structure 38 was characterized by $^1$H, $^{13}$C, and B$^{11}$ NMR spectroscopic techniques. The number average degree of polymerization was 42 (n=21) according to end group analysis. Polymer 1-SnMe3 (Structure 38) appears to lose THF rather easily. Evacuation for 1 hour after removal of THF from the solution left a substoichiometric amount of THF in the solid according to $^1$H NMR spectroscopy in DMF-d$_7$. Further heating at 60° C. under 1 atm for 12 h completely removed THF.

Figure 8:
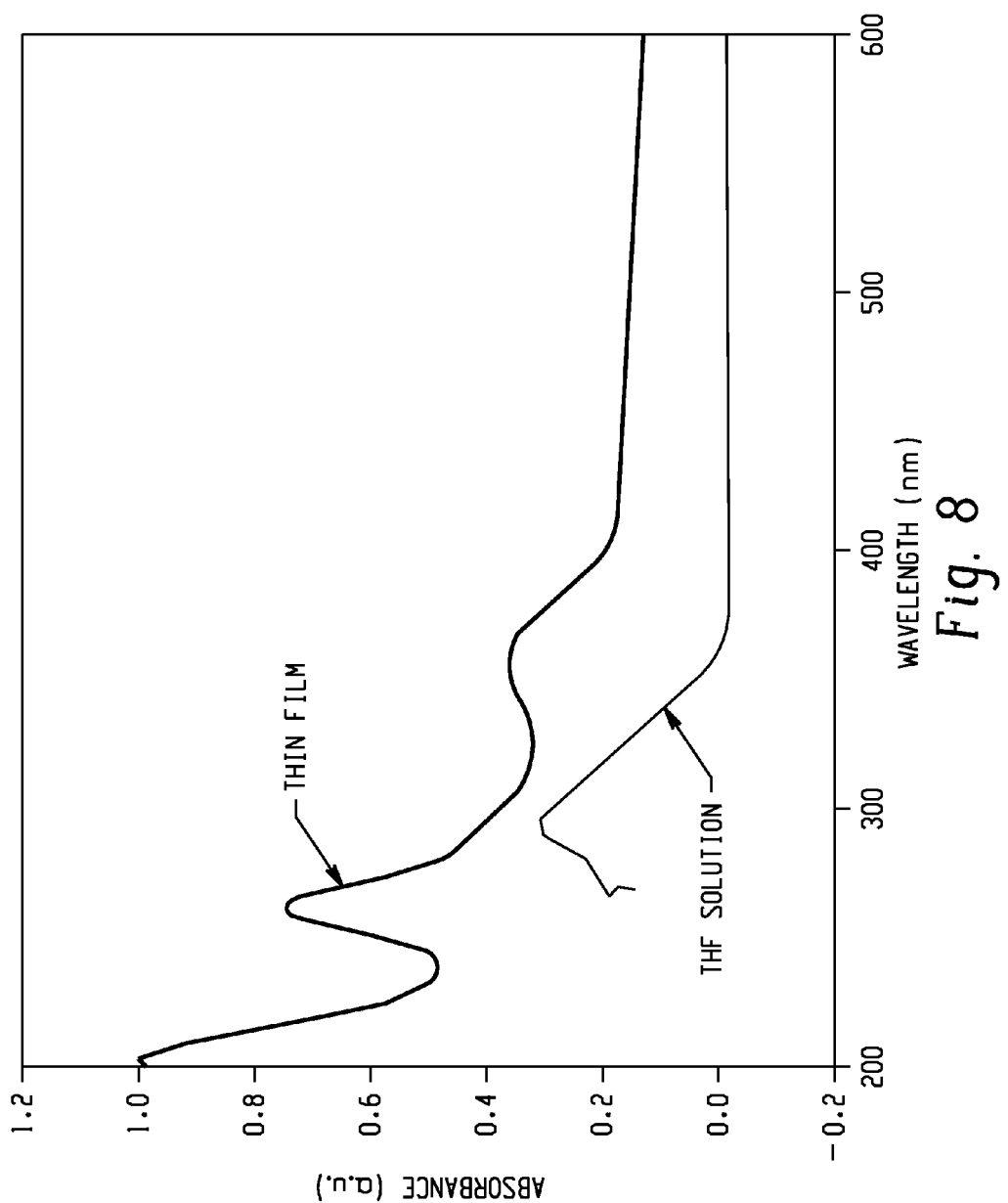
FIG. 8 is a plot of wavelength UV versus absorbance for an exemplary diborylene compound (Structure 37)
Figure 9:
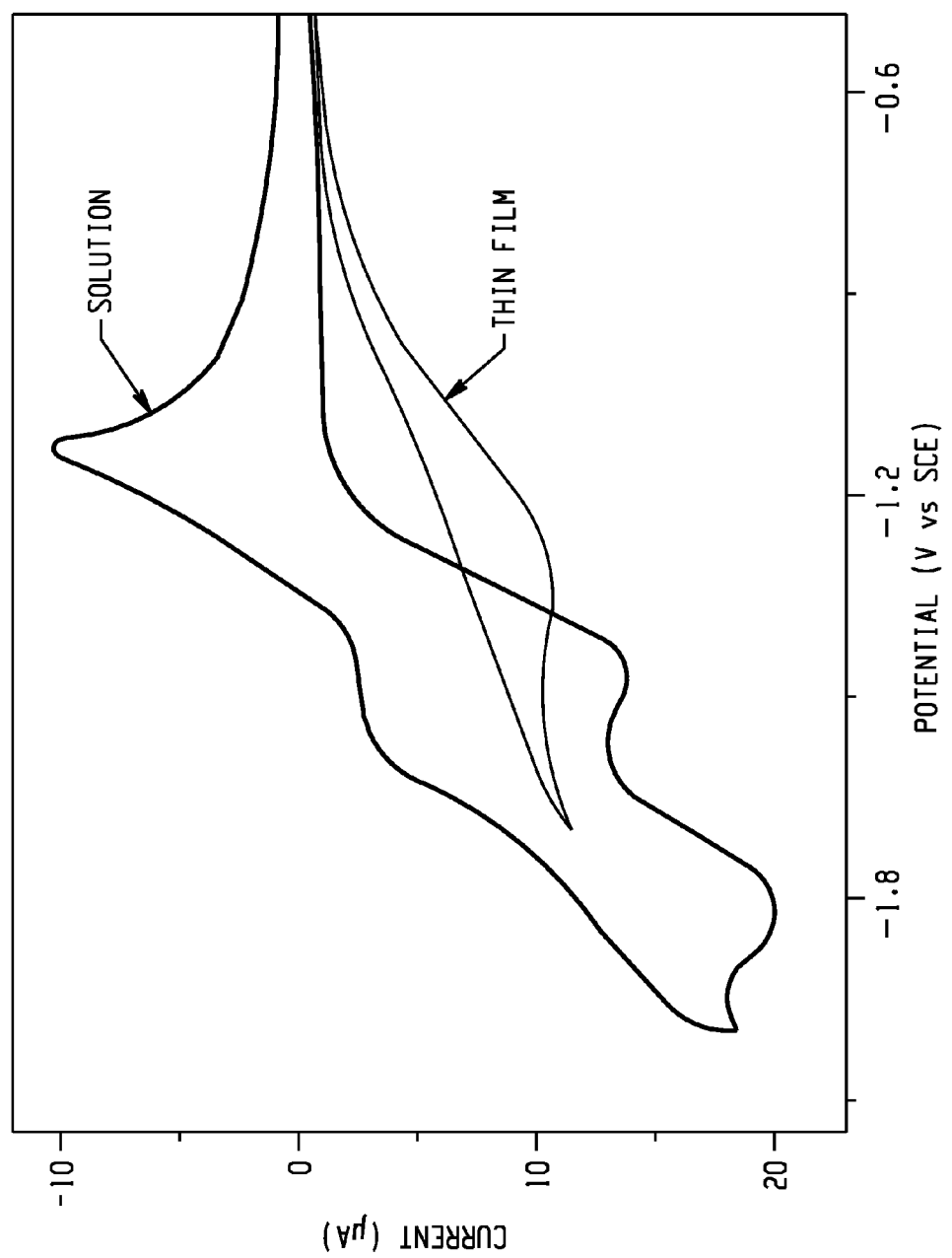
FIG. 9 is a plot of potential versus current for cyclic voltammograms of the exemplary diborylene compound of FIG. 8.

The UV-visible spectroscopic study of 1-SnMe$_3$ (Structure 38) revealed a 70 nm red-shift of the thin film from the solution (FIG. 8), possibly due to loss of THF in the thin film. The cyclic voltammetry of 1-SnMe$_3$ (Structure 38) in THF, as described above, reveals two reversible reductions at $E_{1/2}=-1.33$ V and $-1.76$ V vs SCE. These reduction potentials cannot be directly used for LUMO estimation without correction for THF coordination. In the absence of the equilibrium constant for THF coordination, the thin film of 1-SnMe$_3$ (Structure 38) was measured. The film casted on the electrode was kept under vacuum overnight before the measurement. The skewed cyclic voltammogram (FIG. 9) is likely not due to an irreversible reduction but attributable to the fact that the film flakes off from the Pt electrode when in contact with $CH_2Cl_2$ and continues to do so during the experiment. Nonetheless, the onset of the reduction is between $-0.70$ to $-0.60$ V vs. SCE, corresponding to an LUMO energy at $-3.70$ to $-3.80$ eV. This value is comparable to that of PCBM ($-3.72$ eV) and considerably lower than that of rr-P3HT ($-3.53$ eV).

The invention has been described with reference to the preferred embodiments. Obviously, modifications and alterations will occur to others upon reading and understanding the preceding detailed description. It is intended that the invention be construed as including all such modifications and alterations.

The invention claimed is:

1. A n-type conjugated polymer comprising:
   at least one conjugated electron-acceptor unit, the at least one conjugated electron-acceptor unit comprising a cyclic diborylene unit, and an optional π-conjugated linker unit.

2. The n-type conjugated polymer of claim 1, wherein the cyclic diborylene unit includes two boron atoms in a same at least five membered ring.

3. The n-type conjugated polymer of claim 2, wherein the diborylene unit has the general structure represented by Structure 2:

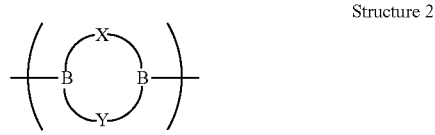

Structure 2 wherein B is a boron atom, X and Y are independently selected from a u-conjugated group and a p-conjugated atom.

4. The n-type conjugated polymer of claim 3, wherein Y is a p-conjugated atom and is selected from S, O and N—R$_0$, wherein R$_0$ is selected from H, alkyl, aromatic and heterocyclic groups, and substituted derivatives and combinations thereof.

5. The n-type conjugated polymer of claim 2, wherein Y is O.

6. The n-type conjugated polymer of claim 2, wherein at least Y is a π-conjugated group selected from fused rings and vinyl groups.

7. The n-type conjugated polymer of claim 1, wherein said diborylene unit has any of the structures represented by Structures 3, 4, 5, 8, and 9 and combinations thereof:

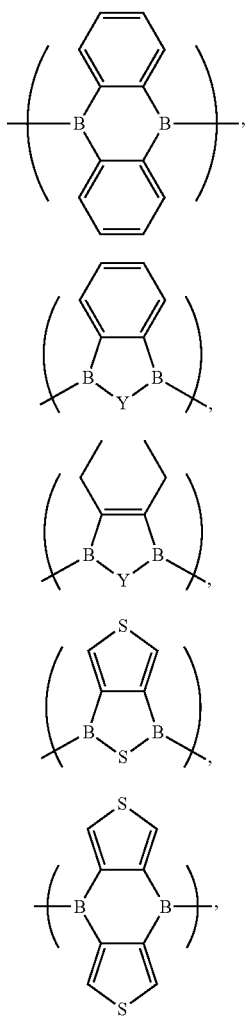

Structure 3

Structure 4

Structure 5

Structure 8

Structure 9

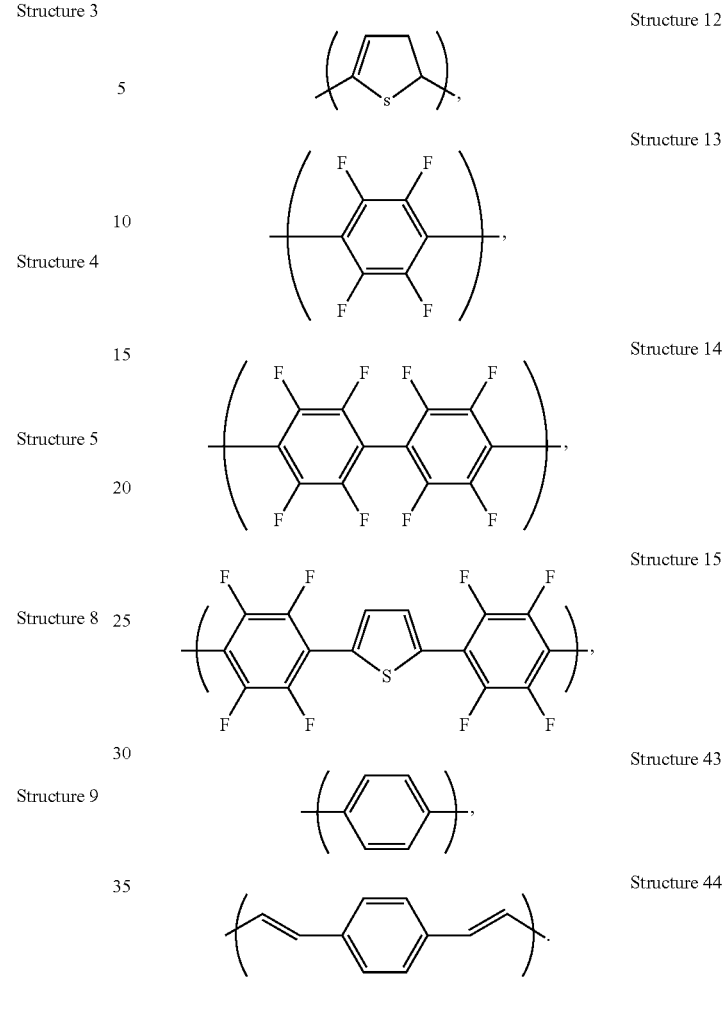

Structure 12

Structure 13

Structure 14

Structure 15

Structure 43

Structure 44 wherein Y is selected from S, O and N—$R_0$ and wherein $R_0$ is selected from H, an alkyl group, an aromatic hydrocarbon group, or a heterocyclic group and substituted derivatives and combinations thereof.

8. The n-type conjugated polymer of claim 1, wherein the at least one diborylene unit comprises a plurality of diborylene units and electron acceptor unit further comprises at least one linkage unit which spaces first and second of the diborylene units.

9. The n-type conjugated polymer of claim 1, wherein the polymer comprises the general structure 11:

Structure 11

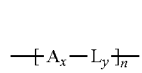

where A is the diborylene unit, L is the linkage unit, and $n > 1$, $x \geq 1$, and $y \geq 0$.

10. The n-type conjugated polymer of claim 9, wherein the linkage unit L comprises at least one of a conjugated $C_3$-$C_{30}$ alkyl group, and a $C_6$-$C_{30}$ aromatic or heteroaromatic group.

11. The n-type conjugated polymer of claim 9, wherein the linkage unit L comprises any of the structures represented by Structures 12, 13, 14, 15, 43 and 44:

12. The n-type conjugated polymer of claim 9, wherein $n \geq 10$.

13. The n-type conjugated polymer of claim 9, wherein the polymer comprises at least one of Structures 16, 17, 18, 19, 20, and 21:

Structure 16

Structure 17

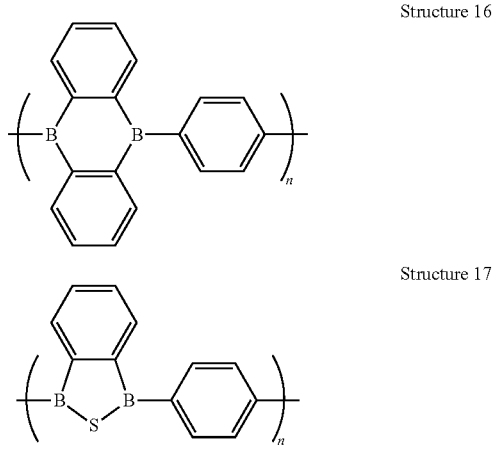

-continued

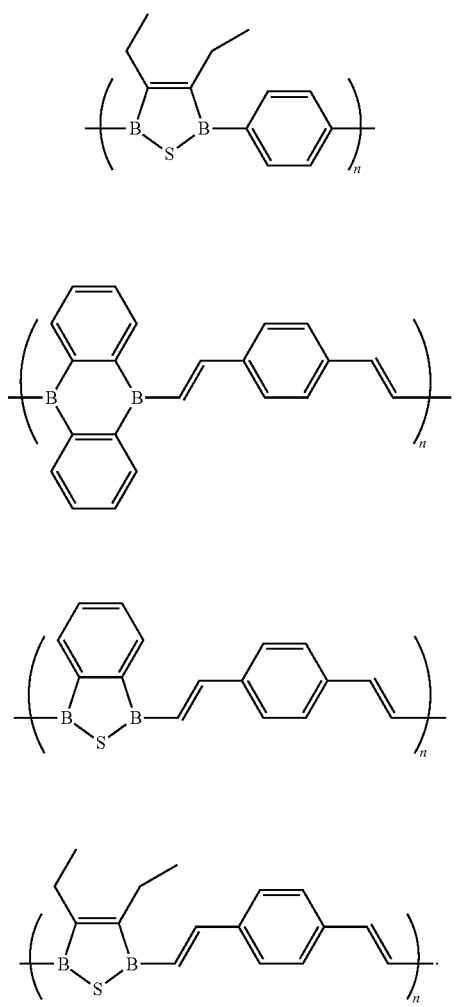

Structure 18

Structure 19

Structure 20

Structure 21

14. The n-type conjugated polymer of claim 1, further comprising at least one conjugated electron-donor unit.

15. The n-type conjugated polymer of claim 14, wherein said at least one conjugated electron-donor unit comprises any of the structures represented by Structures 23, 24, and 25:

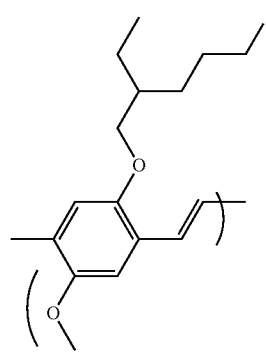

Structure 23 poly[2-methoxy,5-(2'-ethyl-hexyloxy)-
p-phenylene-vinylene]
MEH-PPV

-continued

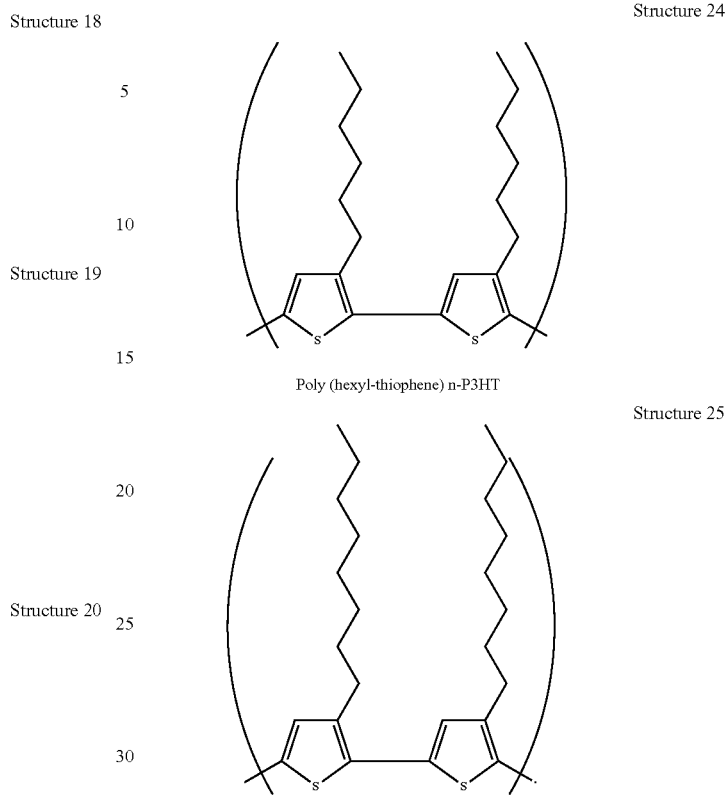

Structure 24

Poly (hexyl-thiophene) n-P3HT

Structure 25

Poly (octyl-thiophene) n-P3OT

16. The n-type conjugated polymer of claim 1, wherein the diborylene units are spaced from the at least one conjugated electron-donor unit by a spacer unit.

17. The n-type conjugated polymer of claim 16, where the spacer unit is represented by $C_tH_{2t+1}$, and wherein $t \geq 0$.

18. The n-type conjugated polymer of claim 1, wherein the polymer has a general structure represented by Structure 25:

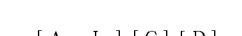

Structure 25 wherein A is the diborylene unit;
L is a conjugated linkage unit;
C is an optional non-conjugated spacer unit;
D is at least a repeat conjugated electron-donor unit;
x is $\geq 1$;
y is $\geq 0$;
w is $\geq 0$;
z is $\geq 1$; and
n is $\geq 1$.

19. The polymer of claim 18, wherein z is $\geq 10$.
20. The polymer of claim 18, wherein x=1 and y=1.
21. The polymer of claim 18, wherein n$\geq 10$.
22. An electronic device comprising a layer of the n-type conjugated polymer of claim 1.
23. The electronic device of claim 22, wherein said electronic device is one of an organic photovoltaic device (OPV), an organic light emitting diode (OLED), and an organic field effect transistor (OFET).
24. A method of forming an n-type conjugated polymer comprising polymerizing a monomer unit having the general structure:

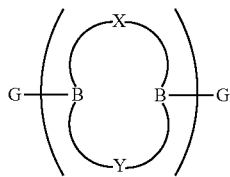

Structure 1 wherein each G is independently a hydrogen or halide, and each X and Y is a π-conjugated group or p-conjugated atom.

25. The method of claim 24, wherein the n-type conjugated polymer comprises:
at least one conjugated electron-acceptor unit, the at least one conjugated electron-acceptor unit comprising a cyclic diborylene unit, and an optional u-conjugated linker unit.

26. The method of claim 24, wherein the polymerizing includes reacting the monomer unit with reagent for providing a linking group between first and second diborylene units derived from the monomer.

27. The method of claim 24, wherein the polymerizing includes reacting the monomer unit with at least one of an alkynl ditin compound and an aryl ditin compound.

28. The method of claim 24, further comprising end capping the polymer with a phenylacetylene.

29. An electronic device comprising:
first and second electrodes; and an active layer which spaces the first and second electrodes, the active layer comprising a n-type conjugated compound comprising at least one cyclic diborylene unit, wherein the at least one cyclic diborylene unit includes two boron atoms in a same ring.

30. The electronic device of claim 29, wherein the active layer further includes an electron blocker.

31. The electronic device of claim 29, wherein the diborylene unit has the general structure represented by Structure 2:

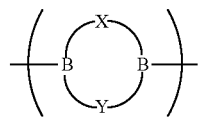

Structure 2 wherein X and Y are independently selected from a π-conjugated group and a p-conjugated atom.

32. The electronic device of claim 29, wherein n-type conjugated compound contains only one diborylene unit.

* * * * *